United States Patent
Hayashida et al.

(10) Patent No.: US 8,900,775 B2
(45) Date of Patent: Dec. 2, 2014

(54) HOLOGRAM RECORDING MATERIAL AND HOLOGRAM RECORDING MEDIUM

(75) Inventors: Naoki Hayashida, Tokyo (JP); Shohei Fujii, Tokyo (JP); Jiro Yoshinari, Tokyo (JP)

(73) Assignee: TDK Corporation, Tokyo (JP)

( * ) Notice: Subject to any disclaimer, the term of this patent is extended or adjusted under 35 U.S.C. 154(b) by 231 days.

(21) Appl. No.: 13/566,371

(22) Filed: Aug. 3, 2012

(65) Prior Publication Data

US 2013/0034805 A1 Feb. 7, 2013

(30) Foreign Application Priority Data

Aug. 5, 2011 (JP) ................ 2011-171895

(51) Int. Cl.
| | |
|---|---|
| G03H 1/02 | (2006.01) |
| G03F 7/00 | (2006.01) |
| G03F 7/027 | (2006.01) |
| G03F 7/033 | (2006.01) |
| G11B 7/24044 | (2013.01) |
| G11B 7/245 | (2006.01) |

(52) U.S. Cl.
CPC ............ *G03F 7/001* (2013.01); *G03H 1/0244* (2013.01); *G03F 7/027* (2013.01); *G03F 7/033* (2013.01); *G11B 7/24044* (2013.01); *G11B 7/245* (2013.01); *G03H 2001/0264* (2013.01); *G03H 2260/12* (2013.01)
USPC ............................. 430/1; 430/2; 359/3

(58) Field of Classification Search
None
See application file for complete search history.

(56) References Cited

U.S. PATENT DOCUMENTS

| | | | | |
|---|---|---|---|---|
| 4,942,112 | A | * 7/1990 | Monroe et al. | ............. 430/282.1 |
| 5,858,614 | A | * 1/1999 | Sato et al. | ................... 430/280.1 |
| 2005/0185232 | A1* | 8/2005 | Teranishi et al. | ................. 359/3 |
| 2010/0003447 | A1* | 1/2010 | Suzuki et al. | ................ 428/65.1 |

FOREIGN PATENT DOCUMENTS

| | | | |
|---|---|---|---|
| JP | 05-009264 | * | 1/1993 |
| JP | 11-035611 | * | 2/1999 |
| JP | B2-2873126 | | 3/1999 |
| JP | B2-3058929 | | 7/2000 |
| JP | A-2001-282082 | | 10/2001 |
| JP | B2-3370762 | | 1/2003 |
| JP | 2004-138872 | * | 5/2004 |

OTHER PUBLICATIONS

Kogelnik, Herwig, "Coupled Wave Theory for Thick Hologram Gratings," The Bell System Technical Journal, Nov. 1969, vol. 48, No. 9, pp. 2909-2947.

* cited by examiner

*Primary Examiner* — Martin Angebranndt
(74) *Attorney, Agent, or Firm* — Oliff PLC

(57) ABSTRACT

A hologram recording material includes a polymerizable monomer (A) that is active in radical polymerization but is substantially inactive in cationic polymerization, a polymerizable monomer (B) that is active in cationic polymerization but is substantially inactive in radical polymerization, and an initiator system (C) that polymerizes at least one of the polymerizable monomer (A) and the polymerizable monomer (B) through irradiation with light. The polymerizable monomer (A) and the polymerizable monomer (B) each have, in its structure, a moiety selected from the group consisting of aromatic rings, halogen atoms other than a fluorine atom, and sulfur atoms not derived from a cyclic sulfide or a mercapto group. A hologram recording medium includes a recording layer composed of the hologram recording material.

9 Claims, 1 Drawing Sheet

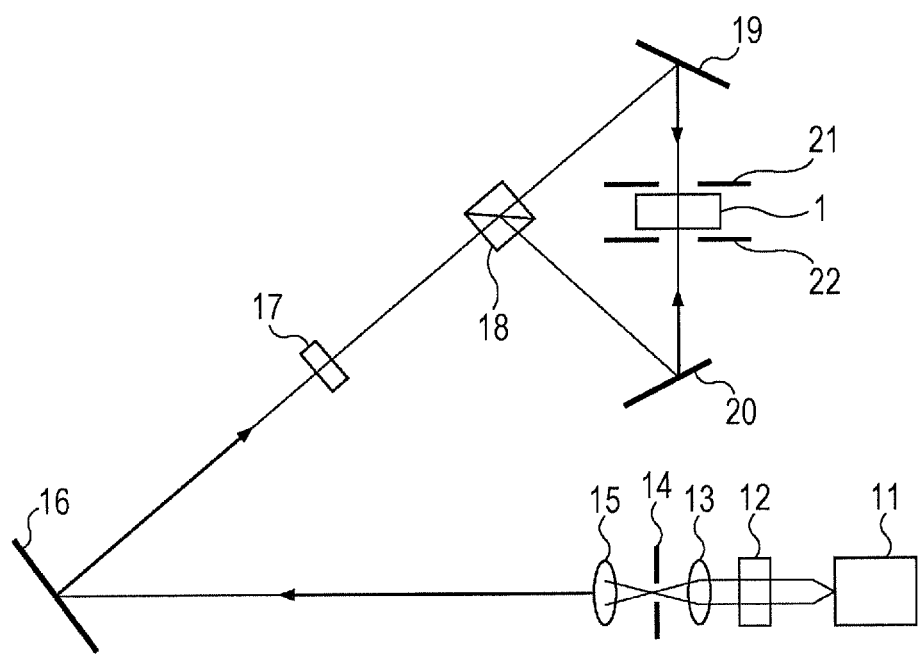

HOLOGRAM RECORDING MATERIAL AND HOLOGRAM RECORDING MEDIUM

BACKGROUND OF THE INVENTION

1. Field of the Invention

The present invention relates to a hologram recording material suitable for volume hologram recording and a hologram recording medium including a hologram recording layer composed of the hologram recording material.

2. Description of the Related Art

Various volume hologram recording materials that use photosensitive resins have been proposed, and some of them have been put to practical use. Photosensitive resins are generally called "photopolymers". Unlike known silver halide photosensitive materials, hologram recording materials that use photopolymers have a significant advantage in that no development treatment is required.

A typical photopolymer material for hologram recording is composed of, for example, a photopolymerizable monomer (I), a polymeric binder (II), a plasticizer (III), and a photopolymerization initiator (IV). By irradiating a hologram recording material formed of the photopolymer material in a layer structure with recording light on which an interference pattern is superimposed, the interference pattern is recorded in the recording material as a refractive index difference (refractive index modulation: $\Delta n$). The reaction mechanism in the recording material is considered to be as follows. That is, the photopolymerization initiator (IV) is cleaved in bright portions of the interference pattern through exposure, which triggers the polymerization of the photopolymerizable monomer (I) present near the photopolymerization initiator (IV). This decreases the concentration of an unreacted monomer in the bright portions, and consequently a monomer concentration gradient is generated between the bright portions and dark portions. To compensate for the generated concentration gradient, the unreacted monomer diffuses from the dark portions to the bright portions and thus the polymerization reaction of the monomer further proceeds in the bright portions. As a result, a large amount of a polymer of the photopolymerizable monomer (I) is present in the bright portions. Herein, by selecting the above-described components so that a refractive index difference between the photopolymerizable monomer (I) (and the polymer thereof) and the other components becomes large, a pattern of the bright and dark portions is recorded as a refractive index modulation ($\Delta n$).

By superimposing, on the interference pattern, reflected light including phase information from a certain subject or three-dimensional image information that is made using a personal computer and output to a spatial light modulator (SLM), a hologram including the three-dimensional image information recorded thereon can be obtained. Furthermore, by superimposing two-dimensional digital data on the interference pattern, a data recording medium that can record and reproduce a large amount of digital data at high speed can be provided. In principle, the refractive index modulation ($\Delta n$) is a performance indicator intrinsic to a recording material and is desirably as high as possible. In the case where the recording material is used for a hologram for image recording, the contrast increases with increasing $\Delta n$. In the case where the recording material is used for a data recording medium, the data storage capacity increases with increasing $\Delta n$.

In particular, when the hologram recording material is used for image recording, it is important to increase the refractive index modulation due to the reason below.

In general, the relationship between refractive index modulation and diffraction spectrum of a volume hologram is described by a coupled wave theory of Kogelnik (H. Kogelnik, "Coupled wave theory for thick hologram gratings", Bell Syst. Tech. J., Vol. 48(9), pp. 2909 to 2947, (1969)). According to this theory, the relationship between the refractive index modulation of a refractive index grating formed in a recording material and the diffraction efficiency and the relationship between the refractive index modulation and the full width at half maximum (FWHM) of a diffraction spectrum can be estimated under certain recording conditions (recording wavelength, the incident angles of two plane waves that form interference fringes, the thickness of a recording material, the average refractive index of a recording material).

In a reflection-type hologram used for image recording, the diffraction efficiency (the peak value of a diffraction spectrum) rapidly increases to 100% with an increase in a refractive index modulation ($\Delta n$) whereas the full width at half maximum substantially linearly increases with an increase in a refractive index modulation $\Delta n$. That is, a higher value of $\Delta n$ is required to achieve both high diffraction efficiency and a large full width at half maximum.

When an image is recorded on a hologram recording material, the brightness of the image is considerably dependent on not only diffraction efficiency (reflectance) but also full width at half maximum. In general, the recorded hologram image is illuminated with white light such as sunlight or light from a white light-emitting diode (LED), and light in a wavelength range corresponding to the diffraction spectrum is diffracted (reflected). Consequently, an observer visually confirms the recorded hologram image.

It has been known that there are a hologram recording material containing, as a high-refractive-index component (or a low-refractive-index component), only a monomer that is active in radical polymerization; a hologram recording material containing, as a high-refractive-index component (or a low-refractive-index component), only a monomer that is active in cationic polymerization; and a hologram recording material containing, as a high-refractive-index component (or a low-refractive-index component), only a monomer that is active in anionic polymerization. In general, radical polymerization is advantageously used to obtain a recording material with high recording sensitivity because the reaction rate of radical polymerization is higher than that of ionic polymerization such as cationic polymerization or anionic polymerization. Therefore, most of publicly known hologram recording materials contain a radical polymerizable monomer as a high-refractive-index component. However, the life of a polymerization active species (radical) in radical polymerization is extremely short (about several nanoseconds to several milliseconds), and thus principal monomer diffusion occurs only during recording exposure. Therefore, a high refractive index modulation cannot be achieved.

Japanese Patent No. 2873126 (Patent Document 1) discloses, as a specific photopolymer material, a photosensitive composition for volume hologram recording including a cationic polymerizable compound (a) that is in a liquid state at room temperature, a radical polymerizable compound (b), a photoradical polymerization initiator system (c) that polymerizes the component (b) through exposure to laser light or coherent light having a certain wavelength, and a photocationic polymerization initiator system that has low photosensitivity to the light having the certain wavelength but polymerizes the component (a) through exposure to light having a wavelength different from the certain wavelength.

The average refractive index of the component (a) is lower than that of the component (b). In other words, the component (a) corresponds to the above-described plasticizer (III). By providing cationic polymerizability to a plasticizer that is in a liquid state at room temperature, the plasticizer is made to serve as a plasticizer that facilitates the diffusion of the photopolymerizable monomer (I) during recording. In addition, the plasticizer can be cured through cationic polymerization using ultraviolet light or the like after the recording. Therefore, a liquid component is not left in a recording film after irradiation with ultraviolet light (called "postcure"), which improves the stability of recording signals.

Japanese Unexamined Patent Application Publication No. 2001-282082 (Patent Document 2) discloses a hologram recording material composition including an allyl-based prepolymer (A), a radical polymerizable compound (B), a viscosity reducing agent (C), and a photopolymerization initiator (D). It is disclosed in paragraph [0083] that the viscosity reducing agent (C) is a compound (C1) that does not react with the allyl-based prepolymer (A) and/or the radical polymerizable compound (B) or a compound (C2) having a (meth) allyl group in its molecule. In Patent Document 2, the viscosity reducing agent (C) corresponds to the above-described plasticizer (III). In the viscosity reducing agent (C), the compound (C2) having a (meth)allyl group in its molecule is active in radical polymerization like the radical polymerizable compound (B). However, since the polymerization activity is lower than that of the component (B), the polymerization of the component (B) preferentially proceeds during recording. At this time, the component (C2) facilitates the diffusion of the component (B). After the polymerization of the component (B), the component (C) is polymerized. Therefore, a liquid component other than the component (C1) is not left in a recording film after exposure, which improves the stability of recording signals as in the case of Patent Document 1.

Japanese Patent No. 3370762 (Patent Document 3) discloses a hologram recording material that does not necessarily include the above-described plasticizer (III), the hologram recording material including a certain polymeric binder, an ethylenically unsaturated monomer, and a photopolymerization initiator. It is disclosed in paragraph [0045] that, in this hologram recording material, the refractive index modulation is increased by performing a heat treatment at 100° C. to 150° C. for 0.5 to 2 hours after hologram recording. The reason for this is unclear, but it is believed that part of the ethylenically unsaturated monomer that has not diffused into bright portions of interference fringes during recording preferentially diffuses into a region where the ethylenically unsaturated monomer has been localized during the recording by a driving force such as a chemical potential difference under heating conditions.

In the materials disclosed in Patent Documents 1 and 2, a hologram is recorded on the basis of the above-described typical recording principle for a photopolymer material. In other words, refractive index modulation is generated due to a decrease in monomer concentration in bright portions of interference fringes during recording exposure and the monomer diffusion that uses, as a driving force, the concentration gradient generated by the decrease in monomer concentration. Therefore, since almost no monomer diffusion occurs when recording exposure is not performed, it is difficult to achieve a high refractive index modulation.

In particular, in the material disclosed in Patent Document 2, part of the viscosity reducing agent (C) corresponding to the plasticizer (III) is active in radical polymerization like the radical polymerizable compound (B). Therefore, the part of the viscosity reducing agent (C) is also polymerized during recording together with the component (B) and thus taken in the bright portions of interference fringes. That is, since the part of the component (C) that should have been localized in dark portions of interference fringes is also present in the bright portions of interference fringes, it is difficult to achieve a high refractive index modulation.

In the material disclosed in Patent Document 3, the refractive index modulation is increased by performing a heat treatment after recording. This means that, even after recording exposure, monomer diffusion can occur under certain conditions. However, the heat treatment is performed under severe conditions such as a maximum temperature of about 150° C. and a maximum duration of about 2 hours. This poses problems in that the material of a substrate on which a recording material is formed is limited, and the heat treatment process is complicated.

SUMMARY OF THE INVENTION

It is an object of the present invention to provide a hologram recording material that realizes a high refractive index modulation, that is, high diffraction efficiency and a large full width at half maximum of a diffraction spectrum, and to provide a hologram recording medium.

As a result of thorough studies, the inventors of the present invention have found that a hologram recording material which can provide a significantly increased refractive index modulation is obtained by using a monomer that is active in radical polymerization and a monomer that is active in cationic polymerization in a combined manner as polymerizable monomers that contribute to formation of a refractive index grating.

According to a first aspect of the present invention, a hologram recording material includes a polymerizable monomer (A) that is active in radical polymerization but is substantially inactive in cationic polymerization, a polymerizable monomer (B) that is active in cationic polymerization but is substantially inactive in radical polymerization, and an initiator system (C) that polymerizes at least one of the polymerizable monomer (A) and the polymerizable monomer (B) through irradiation with light. The polymerizable monomer (A) and the polymerizable monomer (B) each have, in its structure, a moiety selected from the group consisting of aromatic rings, halogen atoms other than a fluorine atom, and sulfur atoms not derived from a cyclic sulfide or a mercapto group.

The polymerizable monomer (A) is preferably a compound having a (meth)acryloyl group, and the polymerizable monomer (B) is preferably a compound having at least one of an epoxy group and an oxetanyl group.

At least one component of the polymerizable monomer (A) and at least one component of the polymerizable monomer (B) each preferably have, in its structure, a 9,9-diarylfluorene skeleton.

The mass ratio of the polymerizable monomer (A) relative to the sum of the polymerizable monomer (A) and the polymerizable monomer (B) is preferably 10% or more and 90%; or less by mass.

The hologram recording material may further include a plasticizer (D) that is in a liquid state at room temperature, the plasticizer (D) having a refractive index lower than an average refractive index of any of the polymerizable monomer (A) and polymerizable monomer (B) by 0.03 or more.

At least one component of the plasticizer (D) may be a cation reactive plasticizer (Dc).

The hologram recording material preferably further includes a polymeric binder (E) having a refractive index lower than an average refractive index of any of the polymerizable monomer (A) and polymerizable monomer (B) by 0.03 or more.

The initiator system (C) may serve as a photoradical initiator system that polymerizes the polymerizable monomer (A) through irradiation with visible light.

The initiator system (C) may also serve as a photocationic initiator system that generates a Brönsted acid or a Lewis acid through irradiation with light.

The hologram recording material may further include a thermal cationic initiator (F) that generates a Brönsted acid or a Lewis acid through heating.

According to a second aspect of the present invention, a hologram recording medium includes a substrate and a hologram recording layer formed on the substrate, the hologram recording layer being composed of the hologram recording material described above.

The hologram recording material according to an embodiment of the present invention includes, as polymerizable monomers that contribute to formation of a refractive index grating, a polymerizable monomer (A) that is active in radical polymerization but is substantially inactive in cationic polymerization and a polymerizable monomer (B) that is active in cationic polymerization but is substantially inactive in radical polymerization. The polymerizable monomer (A) and the polymerizable monomer (B) each have, in its structure, a moiety selected from the group consisting of aromatic rings, halogen atoms other than a fluorine atom, and sulfur atoms not derived from a cyclic sulfide or a mercapto group. Since two types of polymerizable monomers that are polymerized with different reaction mechanisms are used, only one of the monomers (e.g., the polymerizable monomer (A)) that is active in polymerization caused by recording light is diffused and polymerized during the recording exposure. At least part of the other monomer (e.g., the polymerizable monomer (B)) is believed to be diffused together with the polymerizable monomer (A) that is polymerized during the recording exposure, and most of the other monomer is gradually diffused after the recording exposure (without irradiation with light), which is referred to as "dark diffusion". This dark diffusion is driven by the concentration distribution of the polymerizable monomer (A). The polymerizable monomer (A) and the polymerizable monomer (B) each have a moiety selected from the group consisting of aromatic rings, halogen atoms other than a fluorine atom, and sulfur atoms not derived from a cyclic sulfide or a mercapto group. Therefore, the polarities of the monomers, more quantitatively, the solubility parameters (SPs) of the monomers are relatively close, and thus the polymerizable monomer (B) has a high affinity for the polymerizable monomer (A). Furthermore, for example, π-π stacking, which is an interaction between π electrons on aromatic rings, is easily caused. Because of these factors, the polymerizable monomer (B) in the dark portions is gradually diffused into a region where the polymerizable monomer (A) has been localized. As a result, the refractive index modulation derived from the polymerizable monomer (A) and generated during recording exposure is increased, and thus a high refractive index modulation is achieved.

According to the present invention, there are provided a hologram recording material that realizes a high refractive index modulation, that is, high diffraction efficiency and a large full width at half maximum of a diffraction spectrum, and a hologram recording medium. The hologram recording medium is suitably used for not only data recording but also image recording.

BRIEF DESCRIPTION OF THE DRAWING

FIGURE is a plan view schematically showing a hologram recording optical system used in Examples.

DESCRIPTION OF THE PREFERRED EMBODIMENTS

A hologram recording material according to an embodiment of the present invention is a composition including a polymerizable monomer (A) that is active in radical polymerization but is substantially inactive in cationic polymerization, a polymerizable monomer (B) that is active in cationic polymerization but is substantially inactive in radical polymerization, and an initiator system (C) that polymerizes at least one of the polymerizable monomer (A) and the polymerizable monomer (B) through irradiation with light. A hologram recording medium according to an embodiment of the present invention includes a substrate and a hologram recording layer formed on the substrate and composed of the hologram recording material according to an embodiment of the present invention. In this specification, the hologram recording layer may be referred to as "a hologram recording material layer" or simply "a recording material layer".

The polymerizable monomer (A) and the polymerizable monomer (B) are each a compound that has, in its structure, a moiety selected from the group consisting of aromatic rings, halogen atoms other than a fluorine atom, and sulfur atoms not derived from a cyclic sulfide or a mercapto group. By introducing such a moiety into the molecule, the refractive index of the compound is increased. Hereinafter, such a moiety is called "a high-refractive-index moiety". The aromatic rings in the present invention may have a hetero atom such as an oxygen atom, a nitrogen atom, or a sulfur atom.

The polymerizable monomer (A) is preferably a compound having at least one (meth)acryloyl group in its molecule to satisfy the requirement for the polymerizable monomer (A) that is active in radical polymerization but is substantially inactive in cationic polymerization. Herein, the "(meth)acryloyl group" or "(meth)acrylate" is a collective term for methacryloyl groups and acryloyl groups. The polymerizable monomer (B) is preferably a compound having at least one of an epoxy group and an oxetanyl group in its molecule to satisfy the requirement for the polymerizable monomer (B) that is active in cationic polymerization but is substantially inactive in radical polymerization.

Since a mercapto group is active in both radical polymerization and cationic polymerization, a mercapto group does not satisfy the requirement for the polymerizable monomer (A) that is active in radical polymerization but is substantially inactive in cationic polymerization. Similarly, a mercapto group does not satisfy the requirement for the polymerizable monomer (B) that is active in cationic polymerization but is substantially inactive in radical polymerization. Therefore, a compound having a mercapto group cannot be used as the polymerizable monomer (A) or the polymerizable monomer (B) in the present invention. For the same reason, a compound having a vinyloxy group or an amino group also cannot be used as the polymerizable monomer (A) or the polymerizable monomer (B) in the present invention. Note that the polymerization activity (being active in polymerization) herein includes activities in, for example, a chain transfer reaction and a Michael addition reaction.

The polymerizable monomer (A) may be selected from monofunctional or polyfunctional (meth)acrylic acid ester monomers having the high-refractive-index moiety in its molecule. Alternatively, the polymerizable monomer (A) may be an oligomer, such as a dimer or a trimer, of (meth)acrylic acid ester monomers.

Non-limiting examples of the polymerizable monomer (A) include 2,3-dibromopropyl (meth)acrylate, 2,2,3,3-tetrabromopropyl (meth)acrylate, benzyl (meth)acrylate, phenoxyethyl (meth)acrylate, phenylthioethyl (meth)acrylate, phenoxypolyethylene glycol (meth)acrylate, epichlorohydrin (ECH)-modified phenol (meth)acrylate, ethylene oxide (EO)-modified cresol (meth)acrylate, 2-(meth)acryloyloxyethylphthalic acid, 2-(meth)acryloyloxypropylphthalic acid, tribromophenyl (meth)acrylate, o-phenylphenol (meth)acrylate, p-cumylphenol (meth)acrylate, bisphenol A di(meth)acrylate, bisphenol F di(meth)acrylate, tetrabromobisphenol A di(meth)acrylate, tetrabromobisphenol F di(meth)acrylate, 1,4-dihydroxynaphthalene (meth)acrylate, 9,9-bis(4-hydroxyphenyl)fluorene di(meth)acrylate, 9,9-bis(3-methyl-4-hydroxyphenyl)fluorene di(meth)acrylate, 9,9-bis(3,5-dimethyl-4-hydroxyphenyl)fluorene di(meth)acrylate, 9,9-bis(3-phenyl-4-hydroxyphenyl)fluorene di(meth)acrylate, and 9,9-bis(6-hydroxynaphthyl)fluorene di(meth)acrylate; and EO-modified compounds, propylene oxide (PO)-modified compounds, and ECH-modified compounds of the foregoing. Among these compounds, (meth)acrylic acid ester monomers having a 9,9-diarylfluorene skeleton are particularly preferred.

The above-described (meth)acrylic acid ester monomers serving as the polymerizable monomer (A) may be used alone or in combination of two or more. Furthermore, a (meth)acrylic acid ester monomer that does not have the high-refractive-index moiety may be used together with the polymerizable monomer (A). In the present invention, to achieve a high refractive index of the polymerizable monomer (A), the average refractive index of the polymerizable monomer (A) is preferably 1.50 or more and more preferably 1.55 or more. In the present invention, the average refractive index is defined as a weighted average of n20/D (refractive index measured at 20° C. using the D-line of sodium) of a plurality of compounds used for the polymerizable monomer (A).

The polymerizable monomer (B) may be selected from monomers having, in its molecule, at least one of a monofunctional or polyfunctional epoxy group and a monofunctional or polyfunctional oxetanyl group each having the high-refractive-index moiety. Alternatively, the polymerizable monomer (B) may be an oligomer, such as a dimer or a trimer, of monomers having an epoxy group or an oxetanyl group. Examples of the epoxy group include a 1,2-epoxyethyl group (ethylene oxide group) and a 3,4-epoxycyclohexyl group.

In the polymerizable monomer (B), non-limiting examples of the compound having a 1,2-epoxyethyl group include styrene oxide, phenyl glycidyl ether, benzyl glycidyl ether, o-sec-butylphenyl glycidyl ether, o-phenylphenol glycidyl ether, 4,4'-bis(glycidyloxy)-1,1'-biphenyl, 2,2'-bis(glycidyloxy)-1,1'-biphenyl, bis(glycidyloxy)naphthalene, bisphenol A diglycidyl ether, bisphenol F diglycidyl ether, 4,4'-(hexafluoropropylidene)bisphenol diglycidyl ether, 4,4'-cyclohexylidenebisphenol diglycidyl ether, 4,4'-oxybisphenol diglycidyl ether, tetrabromobisphenol A diglycidyl ether, tetrabromobisphenol F diglycidyl ether, 9,9-bis[4-(glycidyloxy)phenyl]fluorene, 9,9-bis[3-methyl-4-(glycidyloxy)phenyl]fluorene, 9,9-bis[3,5-dimethyl-4-(glycidyloxy)phenyl]fluorene, 9,9-bis[3-phenyl-4-(glycidyloxy)phenyl]fluorene, and 9,9-bis[6-(glycidyloxy)naphthyl]fluorene; and EO-modified compounds, PO-modified compounds, and ECH-modified compounds of the foregoing. Among these compounds, 1,2-epoxyethyl group-containing monomers having a 9,9-diarylfluorene skeleton are particularly preferred.

In the polymerizable monomer (B), non-limiting examples of the compound having a 3,4-epoxycyclohexyl group include 1,4-bis[(3,4-epoxycyclohexyl)methoxymethyl]benzene, 4,4'-bis[(3,4-epoxycyclohexyl)methoxymethyl]-1,1'-biphenyl, 2-(3,4-epoxycyclohexyl)ethyldiphenylphosphine oxide, and 10-[2-(3,4-epoxycyclohexyl)ethyl]-9,10-dihydro-9-oxa-10-phosphaphenanthrene-10-oxide; and EO-modified compounds, PO-modified compounds, and ECH-modified compounds of the foregoing. An aromatic skeleton-containing alicyclic epoxy compound disclosed in Japanese Unexamined Patent Application Publication No. 2009-179568 can also be suitably used. Among these compounds, 3,4-epoxycyclohexyl group-containing monomers having a 9,9-diarylfluorene skeleton are particularly preferred.

In the polymerizable monomer (B), non-limiting examples of the compound having an oxetanyl group include 1,4-bis{[3-(ethyloxetan-3-yl)methoxy]methyl}benzene, 3-ethyl-3-phenoxymethyloxetane, 4,4'-bis[3-(ethyloxetan-3-yl)methoxy]-1,1'-biphenyl, 2,2'-bis[3-(ethyloxetan-3-yl)methoxy]-1,1'-biphenyl, bis[3-(ethyloxetan-3-yl)methoxy]naphthalene, bisphenol A bis[3-(ethyloxetan-3-yl)methyl]ether, bisphenol F bis[3-(ethyloxetan-3-yl)methyl]ether, 4,4'-(hexafluoropropylidene)bisphenol bis[3-(ethyloxetan-3-yl)methyl]ether, tetrabromobisphenol A bis[3-(ethyloxetan-3-yl)methyl]ether, tetrabromobisphenol F bis[3-(ethyloxetan-3-yl)methyl]ether, 4,4'-(hexafluoropropylidene)tetrabromobisphenol bis[3-(ethyloxetan-3-yl)methyl]ether, 4,4'-cyclohexylidenebisphenol bis[3-(ethyloxetan-3-yl)methyl]ether, 4,4'-oxybisphenol bis[3-(ethyloxetan-3-yl)methyl]ether, and 9,9-bis{4-[3-(ethyloxetan-3-yl)methoxy]phenyl}fluorene; and EO-modified compounds, PO-modified compounds, and ECH-modified compounds of the foregoing. Among these compounds, oxetanyl group-containing monomers having a 9,9-diarylfluorene skeleton are particularly preferred.

The monomers having an epoxy group and/or an oxetanyl group, which serve as the polymerizable monomer (B), may be used alone or in combination of two or more. Furthermore, an epoxy group and/or oxetanyl group-containing monomer that does not have the high-refractive-index moiety may be used together with the polymerizable monomer (B) (such a monomer is substantially regarded as a cation reactive plasticizer (Dc) described below). In the present invention, to achieve a high refractive index of the polymerizable monomer (B), the average refractive index of the polymerizable monomer (B) is preferably 1.50 or more and more preferably 1.55 or more.

The mass ratio of the polymerizable monomer (A) relative to the sum of the polymerizable monomer (A) and the polymerizable monomer (B) is preferably 10% or more and 90% or less by mass and more preferably 20% or more and 80% or less by mass. If the mass ratio of the polymerizable monomer (A) is less than 10% by mass, the dark diffusion of the polymerizable monomer (B) does not easily occur. If the mass ratio of the polymerizable monomer (A) is more than 90% by mass, the dark diffusion of the polymerizable monomer (B) occurs, but an effect of increasing the refractive index modulation through addition of the polymerizable monomer (B) is not sufficiently produced.

In addition to the polymerizable monomer (A) and the polymerizable monomer (B), a crosslinkable monomer may be added in a small amount. Herein, the term "crosslinkable monomer" means a monomer that reacts with both the polymerizable monomer (A) and polymerizable monomer (B) to facilitate the crosslinking therebetween. Specifically, the crosslinkable monomer includes a reactive group that is active in radical polymerization but is substantially inactive in cationic polymerization and a reactive group that is active in cationic polymerization but is substantially inactive in radical polymerization.

Specific examples of the crosslinkable monomer include glycidyl (meth)acrylate and 3,4-epoxycyclohexylmethyl (meth)acrylate. The crosslinkable monomer is preferably used together because the polymerizable monomer (A) and the polymerizable monomer (B) are crosslinked with each other and thus a stronger network is formed. When the crosslinkable monomer is added together, the ratio of the crosslinkable monomer relative to the sum of the polymerizable monomer (A), the polymerizable monomer (B), and the crosslinkable monomer is preferably 1% or more and 10% or less by mass. The crosslinkable monomer does not necessarily have the high-refractive-index moiety.

An initiator system that polymerizes at least one of the polymerizable monomer (A) and the polymerizable monomer (B) through irradiation with light is used as the initiator system (C). In other words, the initiator system (C) is an initiator system that generates at least one of radicals and cations through irradiation with light. The initiator system (C) needs to generate at least one of radicals and cations through the irradiation with light having a wavelength for hologram recording. When the wavelength is in a visible range of about 400 to 700 nm, it is difficult to generate at least one of radicals and cations using only a single compound. In this case, an initiator (C-1) and a sensitizing dye (C-2) are generally used in a combined manner. Irradiation with light having a certain wavelength excites the sensitizing dye (C-2). As a result, electrons or energy is transferred from the excited sensitizing dye (C-2) to the initiator (C-1), or electrons or energy is transferred from the initiator (C-1) to the excited sensitizing dye (C-2). Thus, the initiator (C-1) generates radicals or cations. In the present invention, the combination of the initiator (C-1) and the sensitizing dye (C-2) is referred to as the initiator system (C). The initiator (C-1) and the sensitizing dye (C-2) may each be composed of two or more compounds. An example of the initiator system (C) is an initiator system composed of a photoradical initiator (C-1r), a photocationic initiator (C-1c), and a sensitizing dye (C-2). Herein, the photocationic initiator is an initiator that generates a Brönsted acid or a Lewis acid through irradiation with light.

Examples of the photoradical initiator (C-1r) include carbonyl compounds such as benzoin ethyl ether, benzophenone, and diethoxyacetophenone; acylphosphine oxide compounds such as 2,4,6-trimethylbenzoyldiphenylphosphine oxide and bis(2,4,6-trimethylbenzoyl)phenylphosphine oxide; organic tin compounds such as tributylbenzyltin; alkylaryl borates such as tetrabutylammonium triphenylbutylborate, tetrabutylammonium tris(tert-butylphenyl)butylborate, and tetrabutylammonium trinaphtylbutylborate; diaryliodonium salts such as diphenyliodonium hexafluorophosphate, diphenyliodonium tetrafluoroborate, and diphenyliodonium hexafluoroantimonate; iron arene complexes such as η5-cyclopentadienyl-η6-cumenyl-iron(1+)-hexafluorophosphate(1-); triazine compounds such as tris(trichloromethyl)triazine; organic peroxides such as 3,3'-di(tert-butylperoxycarbonyl)-4,4'-di (methoxycarbonyl)benzophenone, 3,3',4,4'-tetrakis(tert-butylperoxycarbonyl)benzophenone, di-tert-butylperoxyisophthalate, 2,5-dimethyl-2,5-bis(benzoylperoxy)hexane, and tert-butylperoxy benzoate; and bis-imidazole derivatives such as 2,2'-bis(o-chlorophenyl)-4,4',5,5'-tetraphenyl-1,1'-bis-imidazole.

Examples of a commercially available initiator that can be used as the photoradical initiator (C-1r) include Darocure 1173, Irgacure 184, Irgacure 907 (each manufactured by BASF SE), and BT-2 (manufactured by Chisso Corporation).

Examples of the photocationic initiator (C-1c) include diaryliodonium salts such as diphenyliodonium hexafluorophosphate, diphenyliodonium tetrafluoroborate, diphenyliodonium hexafluoroantimonate, and diphenyliodonium tetrakis(pentafluorophenyl)borate; triarylsulfonium salts such as triphenylsulfonium hexafluorophosphate, triphenylsulfonium hexafluoroantimonate, and (4-phenylthiophenyl)diphenylsulfonium hexafluorophosphate; and sulfonic acid esters, imide sulfonates, dialkyl-4-hydroxysulfonium salts, arylsulfonic acid p-nitrobenzyl esters, and silanol-aluminum complexes.

Examples of the sensitizing dye (C-2) include thioxanthene dyes, merocyanines, coumarins, ketocoumarins, porphyrins, cyanines, thiopyrylium salts, squaryliums, thiazines, and acridines. The sensitizing dye (C-2) may be suitably selected because a suitable sensitizing dye is dependent on the type of initiator (C-1) and the wavelength of light used for hologram recording. The sensitizing dyes (C-2) above may be used alone or in combination of two or more.

In general, the ratio of the sensitizing dye (C-2) relative to 100 parts by weight of the initiator (C-1) is preferably 1 to 100 parts by weight. In the case where the initiator (C-1) is a mixture of the photoradical initiator (C-1r) and the photocationic initiator (C-1c), the ratio of the sensitizing dye (C-2) is preferably 1 to 100 parts by weight relative to 100 parts by weight of one of the photoradical initiator (C-1r) and photocationic initiator (C-1c).

In the hologram recording material according to an embodiment of the present invention, a hologram is recorded by interference exposure using coherent visible light. Subsequently, the hologram is stably fixed by irradiating the entire surface of a recording medium with incoherent light having a wavelength different from that of the light used for hologram recording (this process is called "photo-postcure"). The photo-postcure is performed using, for example, ultraviolet light. In the hologram recording material according to an embodiment of the present invention, one of the polymerizable monomer (A) and the polymerizable monomer (B) is polymerized and diffused during recording exposure, and, after the recording exposure, the other of the polymerizable monomer (A) and the polymerizable monomer (B) is diffused. Consequently, the refractive index modulation (Δn) is increased. Therefore, the initiator system (C) preferably generates one of radicals and cations in accordance with the wavelength of light used for hologram recording and generates the other of radicals and cations during the photo-postcure.

This is achieved by suitably selecting the sensitizing dye (C-2). That is, for example, when the initiator system (C) is composed of a photoradical initiator (C-1r), a photocationic initiator (C-1c), and a sensitizing dye (C-2), the sensitizing dye (C-2) may be selected so that one of the photoradical initiator (C-1r) and photocationic initiator (C-1c) is selectively subjected to spectral sensitization during hologram recording.

In general, the reaction rate of radical polymerization is higher than that of cationic polymerization. Therefore, to obtain a hologram recording material with high recording sensitivity, it is desired that the initiator system generates radicals through irradiation with light having a wavelength for hologram recording and generates cations during photo-postcure. Therefore, the initiator system (C) is preferably composed of a photoradical initiator (C-1r), a photocationic initiator (C-1c), and a sensitizing dye (C-2) with which the photoradical initiator (C-1r) is subjected to spectral sensitization through irradiation with light used for hologram recording.

The hologram recording material may further include a thermal cationic initiator (F) that generates cations, that is, a Brönsted acid or a Lewis acid by heating. In such a configuration, the polymerization of the polymerizable monomer (B) can be facilitated by performing the heat treatment after the hologram recording (called "thermal postcure"). The thermal postcure may be performed before the photo-postcure or may be performed after the photo-postcure. By suitably selecting the thermal cationic initiator (F), the polymerizable monomer (B) can be polymerized under relatively mild conditions that heating is performed at 80° C. to 120° C. for about 10 to 60 minutes. When the hologram recording material includes the thermal cationic initiator (F), the photocationic initiator (C-1c) is not necessarily included.

Examples of the thermal cationic initiator (F) include triarylsulfonium salts such as triphenylsulfonium hexafluorophosphate, triphenylsulfonium hexafluoroantimonate, and (4-phenylthiophenyl)diphenylsulfonium hexafluorophosphate; and trialkylsulfonium salts such as 1-(2-butenyl)tetrahydrothiophenium hexafluoroantimonate and 1-(3-methyl-2-butenyl)tetrahydrothiophenium hexafluoroantimonate. Among them, the triarylsulfonium salts also function as the photocationic initiator (C-1c).

In the present invention, the hologram recording material may further include a plasticizer (D) that is in a liquid state at room temperature. In the hologram recording material, the plasticizer (D) forms a complementary concentration distribution with the polymerizable monomer (A) and the polymerizable monomer (B) and contributes to an increase in a refractive index modulation $\Delta n$. Therefore, the plasticizer (D) preferably has a refractive index lower than those of the polymerizable monomer (A) and polymerizable monomer (B). The difference between the refractive index of the plasticizer (D) and the average refractive index of any of the polymerizable monomer (A) and polymerizable monomer (B) is preferably 0.03 or more and more preferably 0.05 or more.

Non-limiting examples of the plasticizer (D) include dibasic acid esters such as dipentyl malonate, dihexyl malonate, didodecyl succinate, bis(2-ethylhexyl) succinate, didodecyl glutarate, bis(2-ethylhexyl) adipate, didecyl adipate, didodecyl suberate, diethyl sebacate, dibutyl sebacate, bis(2-ethylhexyl) maleate, bis(2-ethylhexyl) fumarate, didodecyl citraconate, and didodecyl mesaconate; polyether glycols and the alkyl ethers thereof such as poly(ethylene glycol), poly(propylene glycol), and poly(tetramethylene glycol); carbonates such as dimethyl carbonate, ethyl methyl carbonate, diethyl carbonate, vinylene carbonate, and propylene carbonate; and organosiloxanes such as poly(dimethylsiloxane), poly(methylphenylsiloxane), hexaethyldisiloxane, 1,3-dibutyl-1,1,3,3-tetramethyldisiloxane, 1,3-bis(3-acetoxypropyl) tetramethyldisiloxane, 1,3,5,7-tetramethylcyclotetrasiloxane, octamethylcyclotetrasiloxane, and dodecamethylcyclohexasiloxane.

A cation reactive plasticizer (Dc) that is in a liquid state at room temperature and has a cation reactive group may be used as the plasticizer (D). A compound having a cation reactive group is preferably used because not only the polymerizable monomer (A) and polymerizable monomer (B) but also the plasticizer (D) is caused to react and is immobilized during the postcure and thus the stability of the recorded hologram over time is improved. When the plasticizer has a cation reactive group, the cation reactive group may be the same reactive group as that of the polymerizable monomer (B), that is, an epoxy group and/or an oxetanyl group. Alternatively, the cation reactive group may be a cation reactive group other than those described above or a cation reactive group that does not contribute to chain polymerization. Herein, the cation reactive group that does not contribute to chain polymerization is, for example, a chain transfer agent. A specific example of such a cation reactive group is a hydroxyl group. Similarly to the plasticizer (D), the cation reactive plasticizer (Dc) has a refractive index lower than the average refractive index of any of the polymerizable monomer (A) and polymerizable monomer (B), and the difference between the refractive index and the average refractive index is preferably 0.03 or more and more preferably 0.05 or more.

Examples of the cation reactive plasticizer (Dc) include cation reactive plasticizers having a 1,2-epoxyethyl group, such as 2-ethylhexyl glycidyl ether, dodecyl glycidyl ether, glycerol diglycidyl ether, diethylene glycol diglycidyl ether, diglycidyl 1,2-cyclohexanedicarboxylate, 1,4-cyclohexanedimethanol diglycidyl ether, 1,4-butanediol diglycidyl ether, 1,6-hexanediol diglycidyl ether, neopentyl glycol diglycidyl ether, poly(ethylene glycol) diglycidyl ether, poly(propylene glycol) diglycidyl ether, and 1,3-bis(3-glycidoxypropyl)-1,1,3,3-tetramethyldisiloxane; compounds having a 3,4-epoxycyclohexyl group, such as 3,4-epoxycyclohexylmethyl-3,4-epoxycyclohexane carboxylate, bis(3,4-epoxycyclohexyl) adipate, bis(3,4-epoxycyclohexyl) suberate, bis(3,4-epoxycyclohexyl) sebacate, and bis[2-(3,4-epoxycyclohexyl)ethyl]tetramethyldisiloxane; compounds having an oxetanyl group, such as 3-ethyl-3-hydroxymethyloxetane, 2-ethylhexyloxetane, ethylene glycol bis(3-ethyl-3-oxetanylmethyl)ether, diethylene glycol bis(3-ethyl-3-oxetanylmethyl)ether, poly(ethylene glycol) bis(3-ethyl-3-oxetanylmethyl)ether, and poly(propylene glycol) bis(3-ethyl-3-oxetanylmethyl)ether; and compounds having a hydroxyl group, such as 1,4-butanediol, 1,6-hexanediol, cyclohexane-1,4-dimethanol, poly(caprolactone)diol, poly(ethylene glycol), poly(propylene glycol), poly(tetramethylene glycol), and 1,3-bis(3-hydroxypropyl)-1,1,3,3-tetramethyldisiloxane.

As the plasticizer (D), a plasticizer having no reactivity and the cation reactive plasticizer (Dc) may be used in a combined manner at any ratio.

The hologram recording material according to an embodiment of the present invention preferably further includes a polymeric binder (E). The polymeric binder (E) provides effects of achieving the predetermined recording film thickness by reducing the fluidity of the hologram recording material and improving the ease of handling of an unrecorded hologram recording medium.

A polymer that is soluble in an organic solvent and compatible with the polymerizable monomer (A), the polymerizable monomer (B), the initiator system (C), and the plasticizer (D) is used as the polymeric binder (E). Herein, the term "polymer" includes the meaning of oligomers (low-molecular-weight polymer formed at a low degree of polymerization).

Examples of the polymeric binder (E) include thermoplastic resins such as a homopolymer of a monomer having an ethylenically unsaturated double bond, a copolymer of the monomer above and other monomers that can be copolymerized with the monomer, a condensation polymer of diol and dicarboxylic acid, a polymer of hydroxycarboxylic acid, and a cellulose derivative.

Examples of the thermoplastic resins include polyvinyl acetate, polyvinyl butyrate, polyvinyl formal, polyacrylic acid, polymethacrylic acid, esters of polyacrylic acid or polymethacrylic acid, cellulose acetate, cellulose triacetate, cellulose acetate butyrate, polyethylene, polypropylene, and polyethylene-vinyl acetate copolymers. The polymeric binders (E) may be used alone or in combination of two or more.

The polymeric binder (E) has a refractive index lower than the average refractive index of any of the polymerizable monomer (A) and polymerizable monomer (B), and the difference between the refractive index and the average refractive index is preferably 0.03 or more and more preferably 0.05 or more.

The weight ratio of the components in the hologram recording material according to an embodiment of the present invention is preferably as follows:
Polymerizable monomer (A) 10 to 40 parts by weight,
Polymerizable monomer (8) 10 to 40 parts by weight,
Initiator system (C) 0.1 to 10 parts by weight,
Plasticizer (D) 5 to 50 parts by weight, and
Polymeric binder (E) 5 to 50 parts by weight.

The weight ratio of the components is more preferably as follows:
Polymerizable monomer (A) 10 to 30 parts by weight,
Polymerizable monomer (B) 10 to 30 parts by weight,
Initiator system (C) 0.5 to 5 parts by weight,
Plasticizer (D) 10 to 40 parts by weight, and
Polymeric binder (E) 10 to 40 parts by weight.

When the polymeric binder (E) is not used, the weight ratio of the components is preferably as follows:
Polymerizable monomer (A) 10 to 40 parts by weight,
Polymerizable monomer (B) 10 to 40 parts by weight,
Initiator system (C) 0.1 to 10 parts by weight, and
Plasticizer (D) 20 to 80 parts by weight.

The weight ratio of the components is more preferably as follows:
Polymerizable monomer (A) 10 to 30 parts by weight,
Polymerizable monomer (B) 10 to 30 parts by weight,
Initiator system (C) 0.5 to 5 parts by weight, and
Plasticizer (D) 35 to 60 parts by weight.

In addition to the above components, various additives such as a surfactant, a polymerization inhibitor, a chain transfer agent, a promoter for promoting radical polymerization and/or cationic polymerization, and an ultraviolet absorber may be added.

The hologram recording material according to an embodiment of the present invention can be produced as a homogeneous composition by mixing the components by a publicly known method. In the mixing, a diluent solvent is preferably added to facilitate the uniform mixing of the components and achieve a viscosity suitable for application. Examples of the diluent solvent include organic solvents having a boiling point of 50° C. or more and 200° C. or less, such as acetone, methanol, ethanol, methyl ethyl ketone, methyl isobutyl ketone, ethyl acetate, n-butyl acetate, propylene glycol monomethyl ether, propylene glycol monomethyl ether acetate, toluene, xylene, anisole, dimethyl sulfoxide, N-methylpyrrolidone, acetonitrile, and tetrahydrofuran; and mixtures of the organic solvents.

The obtained hologram recording material composition solution is applied onto a transparent substrate made of a resin such as polyethylene terephthalate (PET), polycarbonate, triacetyl cellulose (TAC) resin, or polyimide. The diluent solvent is dried to obtain a film-shaped hologram recording material layer. Thus, a hologram recording material layer in which the above-described components have been uniformly dispersed or dissolved is produced.

The hologram recording medium according to an embodiment of the present invention includes a substrate and a hologram recording material layer formed on the substrate. The hologram recording medium may be formed to have a three-layer structure by further covering the hologram recording material layer with another substrate. The thickness of the hologram recording material layer is not particularly limited, and may be suitably set in accordance with the specifications required for a recording apparatus that uses the hologram recording medium. For example, the thickness of the hologram recording material layer may be set to about 5 to 500 µm.

EXAMPLES

The present invention will now be more specifically described based on Examples, but is not limited to Examples.

Example 1

Production of Hologram Recording Medium Sample

A recording material composition solution having the composition shown in Table 1 was prepared as follows.

First, 2.0 g of 9,9-bis[4-(2-acryloyloxyethoxy)phenyl]fluorene (NK Ester A-BPEF manufactured by Shin-Nakamura Chemical Co., Ltd., n20/D=1.62) serving as a polymerizable monomer (A), 2.0 g of a fluorene monomer having a 1,2-epoxyethyl group and a 9,9-diarylfluorene skeleton (OGSOL EG-250 manufactured by Osaka Gas Chemicals Co., Ltd., n20/D=1.58), the fluorene monomer serving as a polymerizable monomer (B), 0.5 g of diethyl sebacate (manufactured by TOKYO CHEMICAL INDUSTRY CO., LTD., n20/D=1.44) serving as a plasticizer (D), 1.0 g of neopentyl glycol diglycidyl ether (manufactured by Sigma-Aldrich Co. LLC., n20/D=1.46) serving as a cation reactive plasticizer (Dc), and 2.0 g of vinyl acetate polymer (manufactured by Sigma-Aldrich Co. LLC., weight-average molecular weight Mw=100,000, n20/D=1.47) serving as a polymeric binder (E) were mixed with each other. Subsequently, 0.25 g of a mixture of 3,3'-di(tert-butylperoxycarbonyl) 4,4'-di (methoxycarbonyl) benzophenone and positional isomers thereof (BT-2 manufactured by Chisso Corporation, 40% anisole solution), the mixture serving as a photoradical initiator (C-1r), 0.1 g of triarylsulfonium hexafluoroantimonate (San-Aid SI-100L manufactured by SANSHIN CHEMICAL INDUSTRY CO., LTD.) serving as a photocationic initiator (C-1c), 10.37 g of an acetone solution (acetone 10.0 g) in which 20 mg of a sensitizing dye (C-2) (Dye-1: 3-butyl-2-[3-(3-butyl-5-phenyl-1,3-benzoxazol-2(3H)-ylidene)prop-1-en-1-yl]-5-phenyl-1,3-benzoxazol-1-ium=hexafluoro-λ5-phosphanuide) was dissolved were added thereto and dissolved therein under stirring to obtain a recording material composition solution. Note that the sensitizing dye has an effect of subjecting the photoradical initiator (C-1r) to spectral sensitization.

The obtained recording material composition solution was applied onto a PET film having a thickness of 100 µm using a bar coater, and then dried at room temperature under reduced pressure overnight to form a recording material layer. The recording material layer had a thickness of about 20 µm. The PET film was attached to a slide glass having a thickness of 1.0 mm so that the recording material layer was in contact with the glass surface. Thus, a hologram recording medium sample was prepared.

Evaluation of Characteristics

The characteristics of the hologram recording medium sample of Example 1 were evaluated using a hologram recording optical system shown in FIGURE. The direction parallel to the sheet surface of FIGURE is defined as a horizontal direction for the sake of convenience.

In FIGURE, a hologram recording medium sample (1) was set so that the recording material layer faced in a direction perpendicular to the horizontal direction.

In the hologram recording optical system shown in FIGURE, an Nd:YAG laser (wavelength: 532 nm) was used as a light source (11) for recording. Light emitted from the light source (11) was spatially filtered and collimated by using an electromagnetic shutter (12), a convex lens (13), a pinhole (14), and a convex lens (15). The light was made to reflect off a mirror (16) and travel through a ½ wavelength plate (17) and was split into two light beams by a beam splitter (18). One of the two split light beams was made to reflect off a mirror (19) and travel through an aperture (21) and the other of the two split light beams was made to reflect off a mirror (20) and travel through an aperture (22) so as to vertically enter the recording material layer of the hologram recording medium sample (1).

A reflection-type hologram was recorded on the hologram recording medium sample (1) using the optical system under the recording conditions that the light intensity was 30 mW/cm$^2$ and the exposure time was 0.5 to 2 seconds (exposure energy: 15 to 60 mJ/cm$^2$). Subsequently, the entire surface of the hologram recording medium sample (1) was irradiated with ultraviolet (UV) light having an intensity of 50 mW/cm$^2$ for 60 seconds (exposure energy: 3000 mJ/cm$^2$). Through the irradiation with UV light (photo-postcure), the photocationic initiator (C-1c) was caused to react to polymerize the polymerizable monomer (B) while at the same time a color derived from the sensitizing dye was completely eliminated.

Then, the hologram recording medium sample subjected to the photo-postcure was set in a spectrophotometer (V-660 manufactured by JASCO Corporation) to measure a transmission spectrum. The diffraction efficiency and diffraction wavelength of the reflection-type hologram at an initial stage were determined from the measured transmission spectrum. The full width at half maximum (FWHM) of the reflection-type hologram was also determined.

The diffraction efficiency η was calculated from the following formula using the diffraction wavelength determined with the spectrophotometer, a transmittance $T_p$ (%) at the diffraction wavelength, and a baseline transmittance $T_o$ (%). Table 3 shows the results.

Diffraction efficiency $\eta(\%) = [(T_0 - T_p)/T_0] \times 100$

In the hologram recording medium sample of Example 1, the diffraction efficiency was 95% and the full width at half maximum at a diffraction wavelength of 530 nm was 29 nm, which were satisfactory results.

Examples 2 to 9 and Comparative Examples 1 to 3

Hologram recording medium samples were produced in the same manner as in Example 1, except that the compounds shown in Tables 1 and 2 were used as constituent components at the ratios shown in Tables 1 and 2. Then, the characteristics of the hologram recording medium samples were evaluated. It should be noted that, in a hologram recording medium sample of Example 4, thermal postcure was performed at 80° C. for one hour after the recording of the reflection-type hologram and the photo-postcure were performed through the same process as that of Example 1. Table 3 shows the results. Tables 1 and 2 also show the indices (n20/D) of the components other than the initiator system (C) and the diluent solvent.

Description of Components Used

Polymerizable monomer (A)

A-BPEF: 9,9-bis[4-(2-acryloyloxyethoxy)phenyl]fluorene (manufactured by Shin-Nakamura Chemical Co., Ltd.)

2-phenoxyethyl acrylate (manufactured by Sigma-Aldrich Co. LLC.)

A-DCP: tricyclodecanedimethanol diacrylate (manufactured by Shin-Nakamura Chemical Co., Ltd.)

Polymerizable monomer (B)

EG-250: fluorene monomer having a 1,2-epoxy group and a 9,9-diarylfluorene skeleton (manufactured by Osaka Gas Chemicals Co., Ltd., epoxy equivalent: 393 g/eq)

benzyl glycidyl ether (manufactured by Sigma-Aldrich Co. LLC.)

CHDC-DG: diglycidyl 1,2-cyclohexanedicarboxylate (manufactured by Sigma-Aldrich Co. LLC.)

Plasticizer (D)

diethyl sebacate (manufactured by TOKYO CHEMICAL INDUSTRY CO., LTD.)

di(ethylene glycol) dibenzoate (manufactured by Sigma-Aldrich Co. LLC.)

tricresyl phosphate (manufactured by Wako Pure Chemical Industries, Ltd.)

Cation reactive plasticizer (Dc)

neopentyl glycol diglycidyl ether (manufactured by Sigma-Aldrich Co. LLC.)

OXT-212: 2-ethylhexyloxetane (manufactured by TOAGOSEI CO., LTD.)

2,4,7,9-tetramethyl-5-decyne-4,7-diol ethoxylate (manufactured by Sigma-Aldrich Co. LLC., Mw=395, light yellow viscous liquid, the compound represented by formula (1) below)

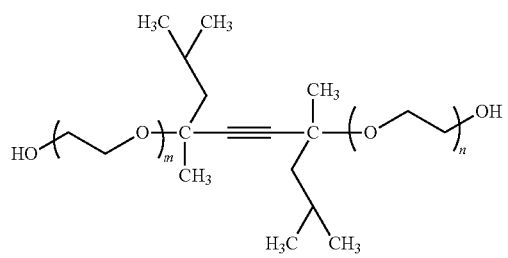

(1)

Polymeric binder (E)

vinyl acetate polymer (manufactured by Sigma-Aldrich Co. LLC., Mw=100,000)

poly(methyl methacrylate) (manufactured by Sigma-Aldrich Co. LLC., Mw=23,800)

Photoradical Initiator (C-1r)

BT-2: mixture of 3,3'-di(tert-butylperoxycarbonyl)-4,4'-di(methoxycarbonyl)benzophenone and positional isomers thereof (manufactured by Chisso Corporation, 40% anisole solution)

Photocationic initiator (C-1c)

SI-100L: triarylsulfonium hexafluoroantimonate (manufactured by SANSHIN CHEMICAL INDUSTRY CO., LTD.)

DAI-B: 4-isopropyl-4'-methyldiphenyliodonium tetrakis(pentafluorophenyl)borate (manufactured by TOKYO CHEMICAL INDUSTRY CO., LTD.)

Sensitizing dye (C-2)

Dye-1: 3-butyl-2-[3-(3-butyl-5-phenyl-1,3-benzoxazol-2(3H)-ylidene)prop-1-en-1-yl]-5-phenyl-1,3-benzoxazol-1-ium=hexafluoro-25-phosphanuide (the compound represented by formula (2) below)

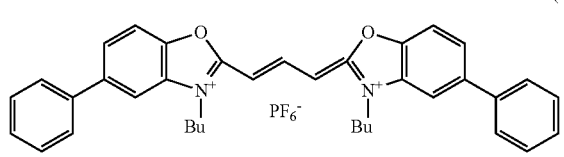

(2)

Dye-2: 2,5-bis(4-dibutylaminobenzylidene)cyclopentanone (the compound represented by formula (3) below)

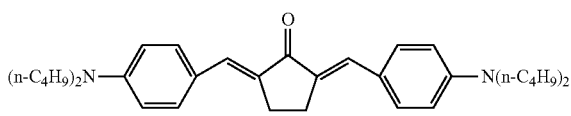

(3)

Thermal cationic initiator (F)

CP-77: 1-(3-methyl-2-butenyl)tetrahydrothiophenium hexafluoroantimonate (manufactured by ADEKA Corporation, 66% propylene carbonate solution, the compound represented by formula (4) below)

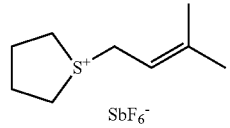

(4)

In Tables 1 and 2, the amounts (g) of components added are each an amount as a non-volatile content. For example, the amount 0.25 g (as a non-volatile content) of BT-2 (40% anisole solution) used in Example 1 corresponds to an actual amount of 0.625 g which includes the amount of anisole.

TABLE 1

| | | | Amount added | | | | | | |
|---|---|---|---|---|---|---|---|---|---|
| | | n20/D | Ex. 1 | Ex. 2 | Ex. 3 | Ex. 4 | Ex. 5 | Ex. 6 | Ex. 7 |
| Polymerizable monomer (A) | A-BPEF | 1.62 | 2.0 g | 2.0 g | 2.0 g | 2.0 g | 2.0 g | | 2.0 g |
| | 2-phenoxyethyl acrylate | 1.52 | | | | | | 2.0 g | |
| | A-DCP | 1.50 | | | | | | | |
| Polymerizable monomer (B) | EG-250 | 1.58 | 2.0 g | 2.0 g | 2.0 g | 2.0 g | 2.0 g | | 2.0 g |
| | benzyl glycidyl ether | 1.52 | | | | | | 2.0 g | |
| | diglycidyl 1,2-cyclohexanedicarboxylate | 1.49 | | | | | | | |
| Plasticizer (D) | diethyl sebacate | 1.44 | 0.5 g | 0.5 g | 0.5 g | 0.5 g | | 0.5 g | |
| | di(ethylene glycol) dibenzoate | 1.54 | | | | | 1.5 g | | |
| | tricresyl phosphate | 1.56 | | | | | | | 1.5 g |
| Cation reactive plasticizer (Dc) | neopentyl glycol diglycidyl ether | 1.46 | 1.0 g | | | 1.0 g | | | |
| | OXT-212 | 1.44 | | 1.0 g | 0.5 g | | | 1.0 g | |
| | 2,4,7,9-tetramethyl-5-decyne-4,7-diol ethoxylate | 1.47 | | | 0.5 g | | | | |
| Polymeric binder (E) | vinyl acetate polymer | 1.47 | 2.0 g | | 2.0 g | 2.0 g | 2.0 g | | 2.0 g |
| | poly(methyl methacrylate) | 1.49 | | 2.0 g | | | | 2.0 g | |
| Photoradical initiator (C-1r) | BT-2 | | 0.25 g | 0.25 g | 0.25 g | 0.25 g | 0.25 g | 0.25 g | 0.25 g |
| Photocationic initiator (C-1c) | SI-100L | | 0.1 g | 0.1 g | 0.1 g | | 0.1 g | 0.1 g | 0.1 g |
| | DAI-B | | | | | | | | |
| Sensitizing dye (C-2) | Dye-1 | | 0.02 g | 0.02 g | 0.02 g | 0.02 g | 0.02 g | 0.02 g | 0.02 g |
| | Dye-2 | | | | | | | | |
| Thermal cationic initiator (F) | CP-77 | | | | | | 0.1 g | | |
| Diluent solvent | acetone | | 10.0 g | 10.0 g | 10.0 g | 10.0 g | 10.0 g | 10.0 g | 10.0 g |

Ex. Example

TABLE 2

| | | | Amount added | | | | |
|---|---|---|---|---|---|---|---|
| | | n20/D | Ex. 8 | Ex. 9 | C.E. 1 | C.E. 2 | C.E. 3 |
| Polymerizable monomer (A) | A-BPEF | 1.62 | 3.2 g | 0.8 g | 4.0 g | | |
| | 2-phenoxyethyl acrylate | 1.52 | | | | | |
| | A-DCP | 1.50 | | | | | 2.0 g |
| Polymerizable monomer (B) | EG-250 | 1.58 | 0.8 g | 3.2 g | | 4.0 g | |
| | benzyl glycidyl ether | 1.52 | | | | | |
| | diglycidyl 1,2-cyclohexanedicarboxylate | 1.49 | | | | | 2.0 g |
| Plasticizer (D) | diethyl sebacate | 1.44 | 0.5 g | 0.5 g | 0.5 g | 1.5 g | 1.5 g |
| | di(ethylene glycol) dibenzoate | 1.54 | | | | | |
| | tricresyl phosphate | 1.56 | | | | | |
| Cation reactive plasticizer (Dc) | neopentyl glycol diglycidyl ether | 1.46 | 1.0 g | 1.0 g | 1.0 g | | |
| | OXT-212 | 1.44 | | | | | |

TABLE 2-continued

|  |  | n20/D | Amount added | | | | |
|---|---|---|---|---|---|---|---|
|  |  |  | Ex. 8 | Ex. 9 | C.E. 1 | C.E. 2 | C.E. 3 |
|  | 2,4,7,9-tetramethyl-5-decyne-4,7-diol ethoxylate | 1.47 | | | | | |
| Polymeric binder (E) | vinyl acetate polymer | 1.47 | 2.0 g | 2.0 g | 2.0 g | 2.0 g | 2.0 g |
|  | poly(methyl methacrylate) | 1.49 | | | | | |
| Photoradical initiator (C-1r) | BT-2 | | 0.25 g | 0.25 g | 0.25 g | | 0.25 g |
| Photocationic initiator (C-1c) | SI-100L | | 0.1 g | 0.1 g | 0.1 g | | 0.1 g |
|  | DAI-B | | | | | 0.1 g | |
| Sensitizing dye (C-2) | Dye-1 | | 0.02 g | 0.02 g | 0.02 g | | 0.02 g |
|  | Dye-2 | | | | | 0.02 g | |
| Thermal cationic initiator (F) | CP-77 | | | | | | |
| Diluent solvent | acetone | | 10.0 g | 10.0 g | 10.0 g | 10.0 g | 10.0 g |

Ex. Example
C.E.: Comparative Example

TABLE 3

|  | Diffraction efficiency η (%) | Full width at half maximum (nm) | Diffraction wavelength (nm) |
|---|---|---|---|
| Example 1 | 95 | 29 | 530 |
| Example 2 | 97 | 32 | 531 |
| Example 3 | 97 | 31 | 530 |
| Example 4 | 98 | 35 | 529 |
| Example 5 | 80 | 27 | 530 |
| Example 6 | 75 | 24 | 531 |
| Example 7 | 78 | 26 | 530 |
| Example 8 | 85 | 23 | 528 |
| Example 9 | 73 | 24 | 530 |
| Comparative Example 1 | 70 | 16 | 521 |
| Comparative Example 2 | 30 | 15 | 528 |
| Comparative Example 3 | 35 | 12 | 530 |

In the hologram recording medium samples of Examples 1 to 9, the polymerizable monomer (A) that is active in radical polymerization and the polymerizable monomer (B) that is active in cationic polymerization were used, both of which had a moiety selected from the group consisting of aromatic rings, halogen atoms other than a fluorine atom, and sulfur atoms not derived from a cyclic sulfide or a mercapto group. Therefore, the polymerizable monomer (B) was diffused after hologram recording in accordance with the concentration distribution of the polymerizable monomer (A), the distribution being formed during the hologram recording, whereby the refractive index modulation Δn was increased. As a result, high diffraction efficiency and a large full width at half maximum of 20 to 35 nm were achieved.

In Comparative Examples 1 and 2, only one of the polymerizable monomer (A) that is active in radical polymerization and the polymerizable monomer (B) that is active in cationic polymerization was used. In Comparative Example 3, the polymerizable monomer (A) and polymerizable monomer (B) did not have any moiety selected from the group consisting of aromatic rings, halogen atoms other than a fluorine atom, and sulfur atoms not derived from a cyclic sulfide or a mercapto group. As a result, the full width at half maximum at a diffraction peak or both the full width at half maximum and diffraction efficiency were significantly lower than those in Examples 1 to 9.

What is claimed is:

1. A hologram recording material comprising:
   a polymerizable monomer (A) that is active in radical polymerization but is substantially inactive in cationic polymerization;
   a polymerizable monomer (B) that is active in cationic polymerization but is substantially inactive in radical polymerization;
   an initiator system (C) that polymerizes at least one of the polymerizable monomer (A) and the polymerizable monomer (B) through irradiation with light; and
   a plasticizer (D) that is in a liquid state at room temperature, the plasticizer (D) having a refractive index lower than an average refractive index of any of the polymerizable monomer (A) and the polymerizable monomer (B) by 0.03 or more,
   wherein at least one component of the polymerizable monomer (A) and at least one component of the polymerizable monomer (B) each have, in its structure, a 9,9-diarylfluorene skeleton.

2. The hologram recording material according to claim 1, wherein the polymerizable monomer (A) is a compound having a (meth)acryloyl group, and the polymerizable monomer (B) is a compound having at least one of an epoxy group and an oxetanyl group.

3. The hologram recording material according to claim 1, wherein the mass ratio of the polymerizable monomer (A) relative to the sum of the polymerizable monomer (A) and the polymerizable monomer (B) is 10% or more and 90% or less by mass.

4. The hologram recording material according to claim 1, wherein at least one component of the plasticizer (D) is a cation reactive plasticizer (Dc).

5. The hologram recording material according to claim 1, further comprising a polymeric binder (E) having a refractive index lower than an average refractive index of any of the polymerizable monomer (A) and polymerizable monomer (B) by 0.03 or more.

6. The hologram recording material according to claim 1, wherein the initiator system (C) serves as a photoradical initiator system that polymerizes the polymerizable monomer (A) through irradiation with visible light.

7. The hologram recording material according to claim 6, wherein the initiator system (C) also serves as a photocationic initiator system that generates a Brönsted acid or a Lewis acid through irradiation with light.

8. The hologram recording material according to claim 1, further comprising a thermal cationic initiator (F) that generates a Brönsted acid or a Lewis acid through heating.

9. A hologram recording medium comprising:
a substrate; and
a hologram recording layer formed on the substrate, the hologram recording layer being composed of the hologram recording material according to claim 1.

* * * * *